(12) United States Patent
Cheng et al.

(10) Patent No.: US 10,797,137 B2
(45) Date of Patent: Oct. 6, 2020

(54) METHOD FOR REDUCING SCHOTTKY BARRIER HEIGHT AND SEMICONDUCTOR DEVICE WITH REDUCED SCHOTTKY BARRIER HEIGHT

(71) Applicants: TAIWAN SEMICONDUCTOR MANUFACTURING CO., LTD., Hsinchu (TW); National Taiwan University, Taipei (TW)

(72) Inventors: Hung-Hsiang Cheng, New Taipei (TW); Samuel C. Pan, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/964,991

(22) Filed: Apr. 27, 2018

(65) Prior Publication Data

US 2019/0006470 A1 Jan. 3, 2019

Related U.S. Application Data

(60) Provisional application No. 62/527,916, filed on Jun. 30, 2017.

(51) Int. Cl.
*H01L 29/47* (2006.01)
*H01L 29/161* (2006.01)
(Continued)

(52) U.S. Cl.
CPC ........ *H01L 29/161* (2013.01); *H01L 21/0485* (2013.01); *H01L 21/28512* (2013.01); *H01L 21/28525* (2013.01); *H01L 21/28537* (2013.01); *H01L 21/324* (2013.01); *H01L 29/16* (2013.01); *H01L 29/45* (2013.01); *H01L 29/47* (2013.01);
(Continued)

(58) Field of Classification Search
CPC . H01L 29/161; H01L 29/47; H01L 29/66143; H01L 29/8725; H01L 29/872; H01L 21/0495; H01L 21/28537
See application file for complete search history.

(56) References Cited

U.S. PATENT DOCUMENTS 5,323,020 A * 6/1994 Mohammad ........ H01L 29/1029
257/19
8,865,543 B2 10/2014 Huang et al.
(Continued)

OTHER PUBLICATIONS

Sze, S.M. Physics of Semiconductor Devices, 2nd Ed. 1981.*

*Primary Examiner* — Eric A. Ward
*Assistant Examiner* — Eric K Ashbahian
(74) *Attorney, Agent, or Firm* — McDermott Will & Emery LLP

(57) ABSTRACT

A method for controlling Schottky barrier height in a semiconductor device includes forming an alloy layer including at least a first element and a second element on a first surface of a semiconductor substrate. The semiconductor substrate is a first element-based semiconductor substrate, and the first element and the second element are Group IV elements. A first thermal anneal of the alloy layer and the first element-based substrate is performed. The first thermal anneal causes the second element in the alloy layer to migrate towards a surface of the alloy layer. A Schottky contact layer is formed on the alloy layer after the first thermal anneal.

20 Claims, 14 Drawing Sheets

(51) Int. Cl.
    *H01L 29/872* (2006.01)
    *H01L 29/66* (2006.01)
    *H01L 21/285* (2006.01)
    *H01L 29/45* (2006.01)
    *H01L 21/324* (2006.01)
    *H01L 21/04* (2006.01)
    *H01L 29/16* (2006.01)

(52) U.S. Cl.
    CPC ...... *H01L 29/66143* (2013.01); *H01L 29/872* (2013.01)

(56) References Cited

U.S. PATENT DOCUMENTS

| | | | |
|---|---|---|---|
| 2003/0183895 A1* | 10/2003 | Okamura | H01L 29/1608 257/454 |
| 2005/0054175 A1* | 3/2005 | Bauer | H01L 21/02381 438/404 |
| 2007/0287276 A1* | 12/2007 | Drobny | H01L 29/66143 438/570 |
| 2011/0284908 A1* | 11/2011 | Muramoto | H01L 33/38 257/98 |
| 2012/0138928 A1 | 6/2012 | Martens et al. | |
| 2013/0299933 A1* | 11/2013 | Knight | H01L 31/0384 257/436 |
| 2014/0001363 A1* | 1/2014 | Koyama | H01L 29/872 250/338.4 |
| 2015/0056786 A1* | 2/2015 | Kinoshita | H01L 29/47 438/478 |
| 2015/0155359 A1* | 6/2015 | Tsai | H01L 23/485 257/190 |
| 2015/0235956 A1 | 8/2015 | Lin et al. | |
| 2016/0071921 A1* | 3/2016 | Koike | H01L 21/28052 257/190 |
| 2016/0133475 A1* | 5/2016 | Huang | H01L 29/812 438/572 |
| 2017/0012113 A1* | 1/2017 | Park | H01L 21/02381 |
| 2017/0032968 A1* | 2/2017 | Nakanishi | H01L 21/02529 |
| 2018/0076324 A1* | 3/2018 | Huang | H01L 29/66643 |

* cited by examiner

METHOD FOR REDUCING SCHOTTKY BARRIER HEIGHT AND SEMICONDUCTOR DEVICE WITH REDUCED SCHOTTKY BARRIER HEIGHT

CROSS-REFERENCE TO RELATED APPLICATIONS

This application claims priority to U.S. Provisional Patent Application 62/527,916 filed Jun. 30, 2017, the entire disclosure of which is incorporated herein by reference.

TECHNICAL FIELD

The disclosure relates to Schottky barrier semiconductor devices, and to their manufacturing processes.

BACKGROUND

Non-ohmic or high resistivity contacts, having a contact resistivity higher than $10^{-4}$ ohm·cm are a roadblock to applications of germanium (Ge) despite its high potential for e.g. Complementary Metal Oxide Semiconductor (CMOS) transistors or memory elements. Both CMOS applications on Ge and Ge selector diodes for memory elements need low contact resistivity. For both optical and electronic devices, metal is deposited on a semiconductor material to serve as an electrical contact. At the junction, a potential barrier is formed known as a Schottky barrier height (SBH). The Schottky barrier height, that is the energy necessary for an average electron to float in the reverse direction across the barriers, is determined largely by the energy difference in the work function between the metal and the semiconductor. For the metal/n-type Ge (or GeSn) junction, however, regardless of the metal that is used or the doping level incorporated in the semiconductor, the Schottky barrier height Ge is around 0.55 electron volt (eV).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
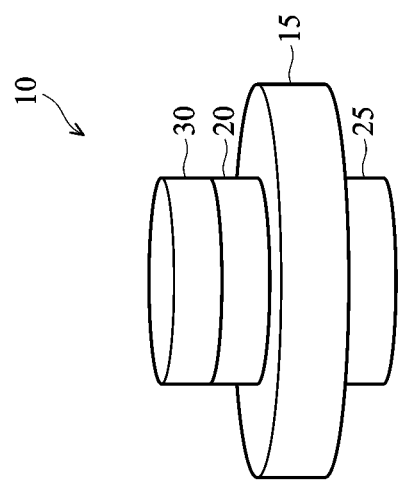
FIG. 1 is an isometric view of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In embodiments of the disclosure, contact resistivity refers to the contribution to the total resistance of a material which emanates from contacting two different types of materials, such as, for example, the contact between an n-type germanium semiconductor material and a material with an electrical resistivity smaller than $1\times10^{-2}$ ohm·cm, such as a metal or a metal silicide. The contact resistivity is the resistivity at the level of the conductive material-semiconductor interface. On the other hand, the intrinsic resistivity is an inherent property of each of the materials.

In general, an ohmic contact is a region on a semiconductor device that has been prepared so that the current-voltage (I-V) curve of the device is linear and symmetric. If the I-V characteristic is non-linear and asymmetric, the contact is not ohmic, but rather, is a Schottky contact. Low-resistance, stable contacts are critical for the performance and reliability of integrated circuits and their preparation and characterization are major efforts in circuit fabrication.

Electrical contacts between n-type germanium (single crystalline or poly-crystalline) and a material with electrical resistivity smaller than $1\times10^{-2}$ ohm·cm typically have a high contact resistivity (higher than $10^{-4}$ ohm·cm$^2$) which is due to Fermi-level pinning and to a low activation of donors in germanium.

For GeSn-based devices (or Ge-based devices) grown by various techniques, different metals such as Al, Au, Er, Gd, Hf, La, Ni, Pt, Sc, Ti, Y, Yb, and Zr, etc. are employed for the fabrication of electrical contacts. These metals can be formed by different deposition techniques, such as e-beam evaporation, atomic layer deposition (ALD), or any other deposition/growth technique suitable to form a crystalline layer. The electrical measurement of current-voltage (I-V), the temperature-dependent I-V, and capacitance-voltage (C-V) measurement on metal/n-type Ge, gives a Schottky barrier height of around 0.55 eV.

Embodiments of this disclosure provide a method for controlling Schottky barrier height on metal/alloy/substrates. In some embodiments, the alloy is an n-type semiconductor alloy including a first element and a second element. In some embodiments, the first and second elements are Group IV elements. The Group IV elements include carbon, silicon, germanium, and tin in some embodiments of the disclosure. In some embodiments of the disclosure, the first element is germanium and the second element is tin. In some embodiments, the method controls the Schottky barrier height on metal/n-type GeSn/n-type Ge-based substrates. In some embodiments, the Schottky barrier height is reduced.

Embodiments of the disclosure provide operations of thermal annealing the alloy layer/substrate at a range of temperatures prior to the deposition of the metal layer. The annealing causes the second element atoms to migrate towards the surface of the alloy layer, forming a thin alloy layer with a second element composition greater than the underlying alloy film second element composition. Consequently, the metal/alloy interfacial layer includes substantial amounts of the second element which results in a different work function and a lower barrier height in the finished semiconductor devices.

The Schottky barrier height determines the electrical characteristics of various semiconductor devices for different applications. For example, in a Schottky diode, the barrier provides the rectifying electrical properties. Some embodiments of the disclosure provide a tunable and smaller Schottky barrier height achieved by the thermal annealing operation that is desirable in some applications.

A semiconductor device 10 according to an embodiment of the disclosure is shown in FIG. 1. The device 10 includes a thin alloy layer 20 including a first element and a second element, wherein the first element and the second element are Group IV elements disposed on a semiconductor substrate 15. In some embodiments, the first and second elements are selected from the group consisting of carbon, silicon, germanium, and tin. In some embodiments, the alloy layer 20 is selected from the group consisting of SiC, SiGe, GeC, SiSn, GeSn, SiGeSn, and SiGeC. In certain embodiments, GeSn is used for the alloy layer 20.

In some embodiments, the semiconductor substrate 15 is a first element-based semiconductor substrate, and the semiconductor substrate is selected from the group consisting of silicon-based substrates, SiC-based substrates, SiGe-based substrates, Ge-based substrates, GeSn-based substrates, SiSn-based substrates, SiGeSn-based substrates, and Sn-based substrates. In certain embodiments, substrate 15 is a germanium semiconductor substrate.

In some embodiments, a metal layer 25 is deposited on the bottom of the substrate 15 and a metal layer 30 is deposited on top of the alloy layer 20. In some embodiments, the metal layer 25 deposited on the bottom of the substrate forms an ohmic contact and the metal layer 25 is selected from the group consisting of In, AuGa, AuSb, Al, Al—Si, TiSi$_2$, TiN, W, MoSi$_2$, PtSi, CoSi$_2$, and WSi$_2$ depending on the type of semiconductor substrate. In some embodiments, the metal layer 30 deposited on the top of the alloy layer 20 forms a Schottky contact and is at least one selected from the group consisting of Al, Au, Er, Gd, Hf, La, Ni, Pt, Sc, Ti, Y, Yb, and Zr depending on the type of alloy layer. In some embodiments, the metal layer 30 is formed by atomic layer deposition (ALD), physical vapor deposition (PVD), including evaporation and sputtering, chemical vapor deposition (CVD), and electroplating.

For example, in some embodiments, an n-type GeSn alloy layer 20, is grown at low temperature on an n-type Ge wafer 15 using molecular beam epitaxy (MBE) and a metal layer 25 is deposited on the bottom of the substrate 15 and a metal layer 30 is deposited on top of the n-type GeSn layer 20.

For example, by epitaxially growing the GeSn alloy layer 20 at a low temperature in a temperature range of about 120° C. to about 210° C., a GeSn alloy layer is obtained with an Sn concentration up to about 12 atomic % based on the total amount of Ge and Sn, having a thickness of from about 0.5 nm up to about 300 nm. Among the epitaxial growth systems molecular beam epitaxy (MBE) or ultra-high vacuum chemical-vapor deposition (UHV-CVD) are used in some embodiments. These deposition techniques are useful for controlling growth parameters. In some embodiments, the epitaxial growth is performed at a temperature range of about 140° C. to about 190° C. In some embodiments, the alloy layer 20 has a thickness of about 20 nm to about 200 nm.

In some embodiments, nickel is the metal layer 30 used for the Schottky contact. When nickel is the metal layer 30 and the alloy layer is GeSn, the Schottky barrier height of the Ni/GeSn interface formed by the processes described herein is 0.52 electron volts or less whereas the barrier height attainable according to conventional processes using the same metal and semiconductor materials ranges from 0.54 to 0.55 electron volts because of the difference of the work functions. In some embodiments, the Schottky barrier height of the Schottky contact metal layer/alloy layer interface ranges from about 0.50 to about 0.52 electron volts.

When the semiconductor device includes an alloy layer having a first element and a second element on a first element-based substrate, it is believed that the improved barrier height characteristics of the metal/alloy interface is due to the use of the thermal annealing, for example, the annealing causes the second element of the alloy to migrate towards the metal/semiconductor interface forming a thin second element layer of about 0.5 nm to about 5 nm thickness in some embodiments. In other embodiments, the thin second element-rich layer has a thickness of about 1 nm to about 3 nm. The thin second element-rich layer provides about a 0.05 eV reduction in the Schottky barrier height at the metal/alloy interface in contrast to semiconductor devices formed without the thermal annealing operation. The higher the annealing temperature the larger the second element content in the surface layer. This in turn affects the work function and results in improved barrier height characteristics. The Schottky barrier height can be further reduced by increasing the second element concentration in the second element-rich layer.

In some embodiments where the first element is Ge and the second element is Sn, the thermal annealing causes the Sn to migrate towards the metal/semiconductor interface forming an Sn rich layer having a thickness of about 0.5 nm to about 5 nm.

Figure 2:
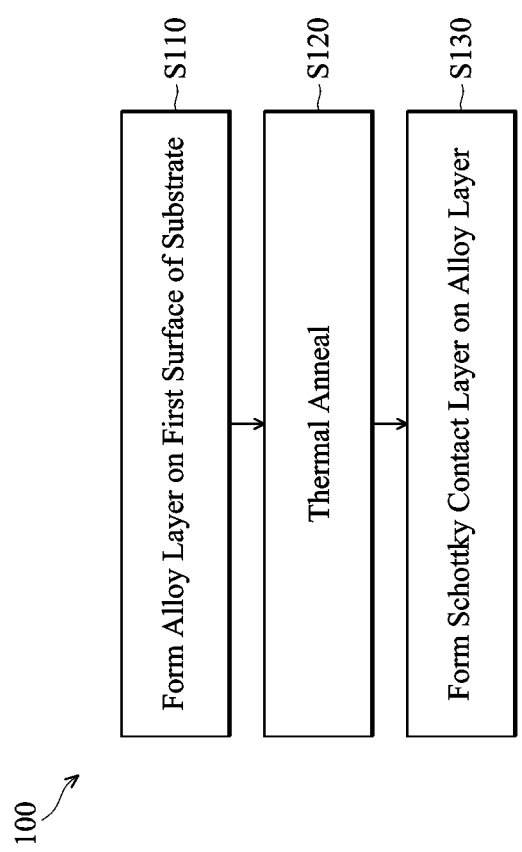
FIG. 2 is a flowchart illustrating a method for fabricating a semiconductor device according to an embodiment of the disclosure.

FIG. 2 is a flowchart illustrating a method 100 for fabricating a semiconductor device according to an embodiment of the disclosure. In operation S110, an alloy layer 20 of at least a first element and a second element, where the first and second elements are Group IV elements, is formed on a semiconductor substrate 15. The semiconductor substrate 15 is a first element-based semiconductor substrate. The semiconductor substrate 15 and alloy layer are thermally annealed in operation S120 after the operation S110 of forming the alloy layer. A Schottky contact layer 30 is subsequently formed on the alloy layer 20 in operation S130.

FIGS. 3-7, 9, 10, and 12 show cross-sectional views of various sequential stages of a process for fabricating a semiconductor device according to embodiments of the present disclosure. It is understood that additional operations can be provided before, during, and after processes shown by FIGS. 3-7, 9, 10, and 12 and some of the operations described below can be replaced or eliminated, for additional embodiments of the method. The order of the operations/processes may be interchangeable.

Figure 3:
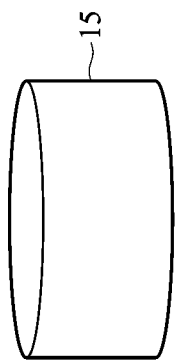
FIG. 3 shows an isometric view of one of the various stages of a sequential process for fabricating a semiconductor device according to an embodiment of the present disclosure.

FIG. 3 shows an isometric view of a sequential process for manufacturing a semiconductor device according to an embodiment of the present disclosure. As shown in FIG. 3, a semiconductor substrate 15 is provided. The semiconductor substrate 15 is a Group IV element-based substrate in some embodiments. In some embodiments, the semiconductor substrate 15 is an alloy of two or more Group IV elements. In some embodiments, the semiconductor substrate 15 is selected from the group consisting of silicon-based substrates, SiC-based substrates, SiGe-based substrates, Ge-based substrates, GeSn-based substrates, SiSn-based substrates, SiGeSn-based substrates, and Sn-based substrates.

In some embodiments, the semiconductor substrate 15 is a Group IV element-based substrate selected from the group consisting of a Group IV element wafer, a Group IV element-on-insulator (GOI) substrate, or an epitaxial Group IV layer. In some embodiments, the semiconductor substrate 15 is an n-type Ge-based substrate selected from the group consisting of a Ge wafer, a Ge-on-insulator (GOI) substrate, or an epitaxial Ge layer. In some embodiments, the n-type Ge-based substrate is a Ge layer formed on a silicon wafer. The thickness of the Ge layer of the Ge-based substrate ranges from about 10 nm to about 1 μm in some embodiments. The thickness of the Ge layer of the Ge-based substrate ranges from about 25 nm to about 500 nm in other embodiments, and from about 50 nm to about 250 nm in other embodiments.

In some embodiments, the semiconductor substrate is doped with impurities. In some embodiments, impurity is implanted into the substrate 15 using an ion implantation operation. In some embodiments, the impurity is one or more selected from the group consisting of boron, aluminum, gallium, phosphorus, arsenic, and antimony. The concentration of the impurity ranges from about $1 \times 10^{17}$ atoms/cm$^3$ to about $1 \times 10^{21}$ atoms/cm$^3$ in some embodiments.

Figure 4:
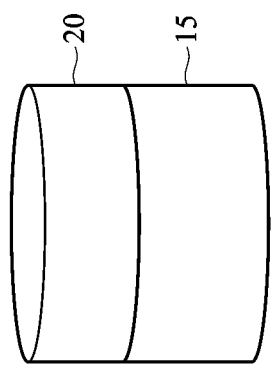
FIG. 4 shows an isometric view of one of the various stages of a sequential process for fabricating a semiconductor device according to an embodiment of the present disclosure.

An alloy layer 20 is subsequently deposited on the semiconductor substrate 15, as shown in FIG. 4. The alloy layer can be deposited by chemical vapor deposition (CVD) or molecular beam epitaxy (MBE) in some embodiments. In some embodiments, the alloy layer 20 is grown with the same composition and concentration of impurities as the substrate 15. In some embodiments, the alloy layer 20 includes a first element and a second element where the first element and second element are Group IV elements. In some embodiments, the concentration of the second element in the alloy layer 20 is constant in a layer thickness direction, while in other embodiments, the second element concentration is graded such that the concentration of the second element is a minimum at an interface of the substrate 15 and the alloy layer 20 and a concentration of the second element is at a maximum at an interface of the alloy layer 20 and a subsequently formed Schottky contact layer 30.

In some embodiments, the alloy layer 20 as formed on the substrate 15 has a second element content of about 0.1 atomic % to about 12 atomic % based on a total amount of first element and the second element alloy layer 20. In some embodiments, the second element concentration of the alloy layer 20 is about 1 atomic % to about 8 atomic %. In some embodiments, the second element concentration of the alloy layer 20 is about 2 atomic % based on the total first element and second element content. At a 2% or less second element concentration, dislocations are prevented from forming in alloy layers deposited by molecular beam epitaxy in some embodiments.

In some embodiments, the alloy layer 20 is an n-type GeSn layer deposited on a Ge-based substrate 15. The GeSn layer 20 is deposited by molecular beam epitaxy (MBE) at a base pressure of about $10^{-7}$ Torr in some embodiments. For example, in some embodiments, solid source MBE is used, where the Ge is evaporated using an electron beam and the Sn is evaporated in an effusion cell. In some embodiments the Sn concentration in the GeSn layer 20 is constant, while in other embodiments, the Sn concentration is graded such that the concentration of Sn is a minimum at an interface of the substrate 15 and the GeSn layer 20 and the concentration of the Sn is at a maximum at an interface of the GeSn layer 20 and the Schottky contact layer 30. In some embodiments, the GeSn layer 20 as formed on the Ge-based substrate 15 has an Sn content of about 0.1 atomic % to about 12 atomic % based on a total amount of Ge and Sn in the GeSn layer 20. In some embodiments, the Sn concentration of the GeSn layer 20 is about 1 atomic % to about 8 atomic %. In some embodiments, the Sn concentration of the GeSn layer 20 is about 2 atomic % based on the total Ge and Sn content. At a 2% or less Sn concentration, dislocations are prevented from forming in GeSn layers deposited by molecular beam epitaxy in some embodiments.

Figure 5:
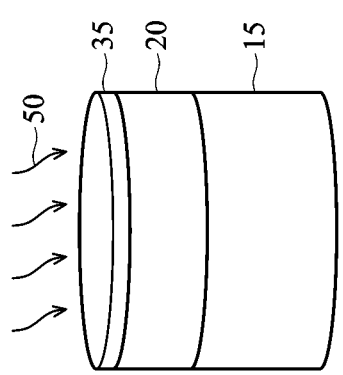
FIG. 5 shows an isometric view of one of the various stages of a sequential process for fabricating a semiconductor device according to an embodiment of the present disclosure.

As shown in FIG. 5, thermal annealing 50 is subsequently performed on the semiconductor device in some embodiments. The thermal annealing 50 is performed at a temperature range from about 350° C. to about 460° C. in some embodiments. In some embodiments, the thermal annealing 50 is performed by placing the substrate on a heating element for about 10 seconds to about 60 seconds in an inert atmosphere. In some embodiments the substrate is placed on the heating element for about 30 seconds in the inert atmosphere. In some embodiments, the heating element is a hot plate and the substrate is placed on the hot plate. The inert atmosphere includes nitrogen, helium, or argon gases in some embodiments. In other embodiments, the semiconductor device is thermally annealed by placing it in an oven, exposing it to infrared radiation, such as an infrared heat lamp, or exposing it to laser radiation.

The thermal annealing operation 50 causes the second element in the alloy layer 20 to migrate towards the surface of the alloy layer 20 away from the substrate 15, thereby creating a thin second element-rich layer 35 at the surface of the alloy layer 20. The concentration of the second element in the second element-rich layer 35 ranges from about 14% to about 25% in some embodiments, and a concentration of the second element in other portions of the alloy layer 20 ranges from about 0.1 atomic % to about 12 atomic % based on a total amount of the first and second elements in the alloy layer. In some embodiments, the thickness of the second element-rich layer 35 ranges from about 0.5 nm to about 5 nm. In some embodiments, the thickness of the second element-rich layer 35 ranges from about 1 nm to about 3 nm. In a certain embodiment, the first element is Ge and the second element is Sn.

Figure 6:
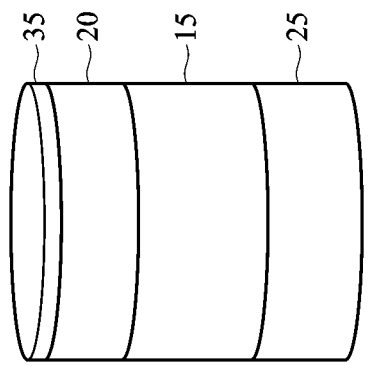
FIG. 6 shows an isometric view of one of the various stages of a sequential process for fabricating a semiconductor device according to an embodiment of the present disclosure.

As shown in FIG. 6, an ohmic contact layer 25 is subsequently formed on the semiconductor substrate 15 on an opposite side of the substrate 15 from the alloy layer 20 in some embodiments. The ohmic contact layer can be a single crystalline metal layer that does not form a junction with a significant Schottky barrier height at the interface with the alloy layer. In some embodiments, the ohmic contact layer 25 is selected from the group consisting of In, AuGa, AuSb, Al, Al—Si, $TiSi_2$, TiN, W, $MoSi_2$, PtSi, $CoSi_2$, and $WSi_2$ depending on the semiconductor substrate. The ohmic contact metal can be applied by other techniques, including physical vapor deposition (PVD), including sputtering and evaporation, atomic layer deposition (ALD), chemical vapor deposition, and electroplating. In some embodiments, other metals are used as the ohmic contact layer 25.

In some embodiments, the ohmic contact layer 25 is an In, AuGa, or AuSb layer formed on a Ge-based substrate 15 on an opposite side of the substrate 15 from a GeSn alloy layer 20. In some embodiments, the ohmic contact layer is formed of AuSb deposited by an evaporation process.

Figure 7:
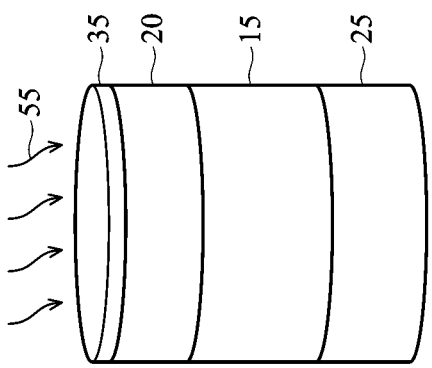
FIG. 7 shows an isometric view of one of the various stages of a sequential process for fabricating a semiconductor device according to an embodiment of the present disclosure.

The ohmic contact layer 25 is subsequently thermally annealed 55, as shown in FIG. 7 at a temperature ranging from about 350° C. to 420° C. in some embodiments. A second thermal anneal 55 is performed on the semiconductor device to anneal the ohmic contact layer 25 by exposing the device to a heating element for about 30 seconds in an inert atmosphere in some embodiments. The inert atmosphere includes nitrogen or argon gases in some embodiments. In other embodiments, the semiconductor device is thermally annealed by placing it in an oven, exposing it to infrared radiation, such as an infrared heat lamp, or exposing it to laser radiation. In some embodiments, the first thermal annealing operation 50 and the second thermal annealing operation 55 are performed as single annealing operation 55 after the forming the ohmic contact layer 25.

Figure 8:
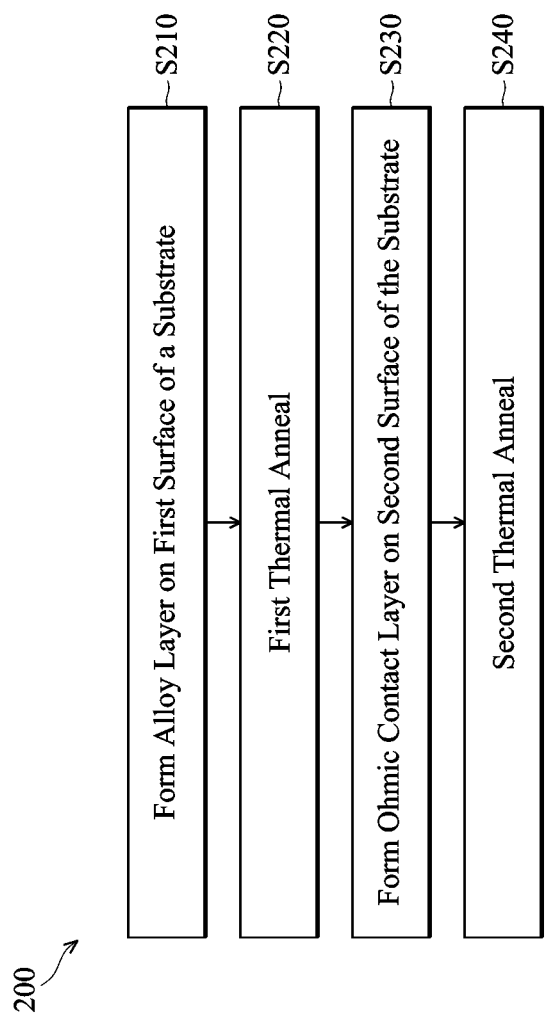
FIG. 8 is a flowchart illustrating a method for fabricating a semiconductor device according to an embodiment of the disclosure.

FIG. 8 shows a flowchart for a method 200 for fabricating a semiconductor device illustrated in FIGS. 3-7. The method includes an operation S210 of forming an alloy layer 20 on a first surface of a substrate 15. After the operation of forming the alloy layer 20, an operation S220 of performing a first thermal anneal. Next, an operation S230 of forming an ohmic contact layer 25 on a second surface of the substrate 15 is performed. An operation S240 of performing a second thermal anneal is subsequently performed after the operation S230 of forming the ohmic contact layer 25.

Figure 9:
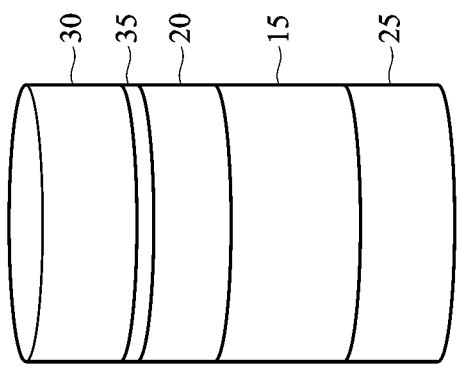
FIG. 9 shows an isometric view of one of the various stages of a sequential process for fabricating a semiconductor device according to an embodiment of the present disclosure.

As shown in FIG. 9, a Schottky contact layer 30 is formed on the alloy layer 20 on an opposite side of the alloy layer 20 from the semiconductor substrate 15 in some embodiments. The Schottky contact layer can be a crystalline metal layer that forms a junction with a substantial Schottky barrier height at the interface with the alloy layer 20. In some embodiments, the Schottky contact layer 30 is formed of at least one metal selected from the group consisting of Al, Au, Er, Gd, Hf, La, Ni, Pt, Sc, Ti, Y, Yb, and Zr. The at least one metal is deposited by an electron beam physical vapor deposition process in some embodiments. The Schottky contact metal can be other metals that form a Schottky contact, and the Schottky contact metal can be applied by other techniques, including physical vapor deposition (PVD), including evaporation and sputtering, atomic layer deposition (ALD), and electroplating. In some embodiments, the Schottky contact layer 30 is a nickel layer.

Figure 10:
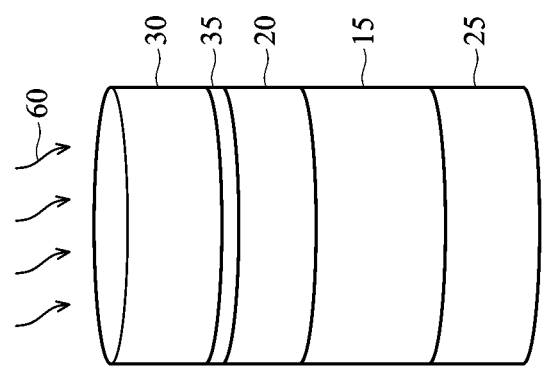
FIG. 10 shows an isometric view of one of the various stages of a sequential process for fabricating a semiconductor device according to an embodiment of the present disclosure.

After forming the Schottky contact layer 30, the device is subsequently thermally annealed 60, as shown in FIG. 10, at a temperature ranging from about 300° C. to 460° C. in some embodiments. A third thermal anneal 60 is performed on the semiconductor device to anneal the device by placing the device on a heating element for about 10 seconds to about 60 seconds in some embodiments. In some embodiments, the device is placed on the hotplate for about 30 seconds in an inert atmosphere. The inert atmosphere includes nitrogen or argon gases in some embodiments. In other embodiments, the semiconductor device is thermally annealed by placing it in an oven, exposing it to infrared radiation, such as an infrared heat lamp, or exposing it to laser radiation.

In a certain embodiment the Schottky contact metal is nickel formed on an Sn-rich interfacial layer 35 of an GeSn alloy layer on a Ge substrate 15, and the device is annealed at 350° C. after forming the nickel layer.

The second and third thermal annealing operations contribute to the second element migration in the alloy layer 20 in some embodiments.

In some embodiments, the alloy layer 20 and the ohmic contact layer 25, or the alloy layer 20 and the Schottky contact layer 30 are simultaneously thermally annealed. In some embodiments, the alloy layer 20, ohmic contact layer 25, and Schottky contact layer 30 are simultaneously thermally annealed in a single thermal annealing operation.

Figure 11:
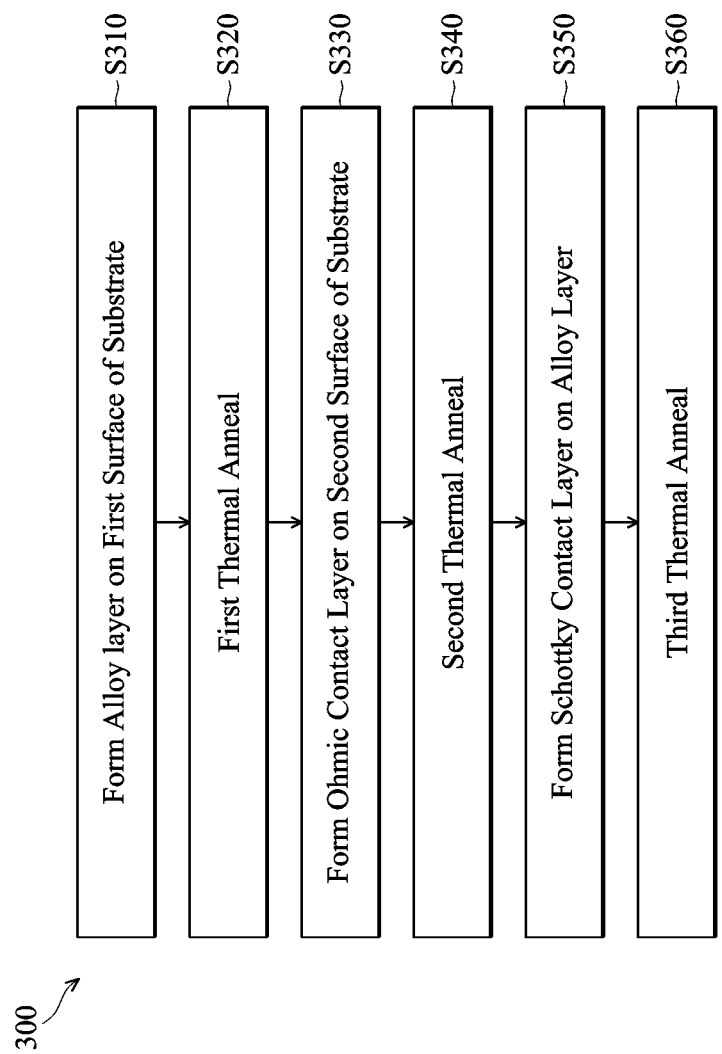
FIG. 11 is a flowchart illustrating a method for fabricating a semiconductor device according to an embodiment of the disclosure.

FIG. 11 shows a flowchart for a method 300 for fabricating a semiconductor device illustrated in FIGS. 3-7, 9 and 10. The method includes an operation S310 of forming an alloy layer 20 on a first surface of a substrate 15. After forming the alloy layer 20, an operation S320 of a first thermal annealing is performed. Next, an operation S330 of forming an ohmic contact layer 25 on a second surface of the substrate 15 is performed after the first thermal annealing operation S320. An operation S340 of performing a second thermal anneal is subsequently performed. Then, an operation S350 of forming a Schottky contact layer 30 on the alloy layer 20 is performed after the second thermal annealing operation S340. The semiconductor device is subsequently subjected to an operation S360 of performing a third thermal anneal.

Figure 12:
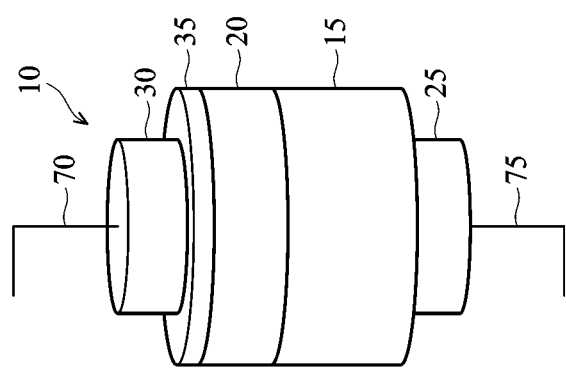
FIG. 12 shows an isometric view of one of the various stages of a sequential process for fabricating a semiconductor device according to an embodiment of the present disclosure.

After the annealing operations, the semiconductor device 10 undergoes further processing, as shown in FIG. 12, including patterning the ohmic and Schottky contact layers 25, 30, attaching leads 70, 75 to the contact layers, and adapting the semiconductor device 10 to be incorporated into larger components or circuitry (not shown). The leads 70, 75 can be any suitable conductive material, such as a conductive metal. The shape of the Schottky contact layer 30 is circular or rectangular in some embodiments, or any other shape with a crystalline structure.

Figure 13:
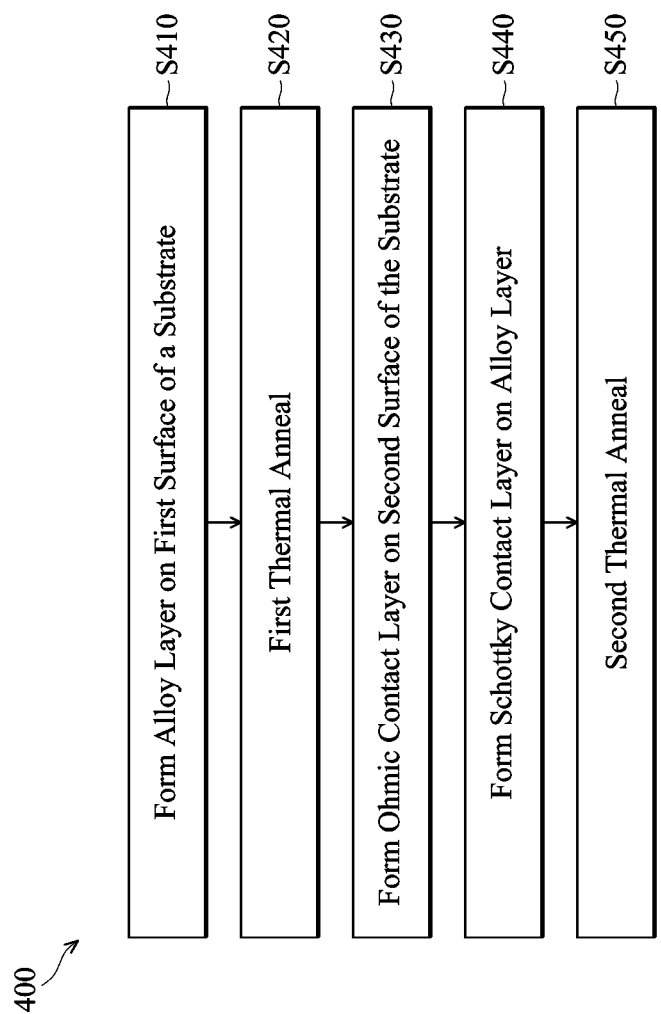
FIG. 13 is a flowchart illustrating a method for fabricating a semiconductor device according to an embodiment of the disclosure.

In some embodiments, a second thermal anneal is performed after forming both the ohmic contact layer 25 and the Schottky contact layer 30. As shown in FIG. 13, a method 400 for fabricating a semiconductor device includes an operation S410 of forming an alloy layer 20 on a first surface of the substrate 15. An operation S420 of performing the first thermal anneal is carried out after the operation S410 of forming the alloy layer 20. After performing the first thermal anneal operation S420, an operation S430 of forming an ohmic contact layer 25 on the second surface of the substrate 15 is performed. An operation S440 of forming a Schottky contact layer 30 on the alloy layer 20 is performed after forming the ohmic contact layer 25. An operation S450 of performing a second thermal anneal is performed after forming the ohmic contact layer 25 and the Schottky contact layer 30.

In some embodiments, the alloy layer 20, ohmic contact layer 25, and Schottky contact layer 30 are simultaneously thermally annealed in a single thermal annealing operation.

Figure 14:
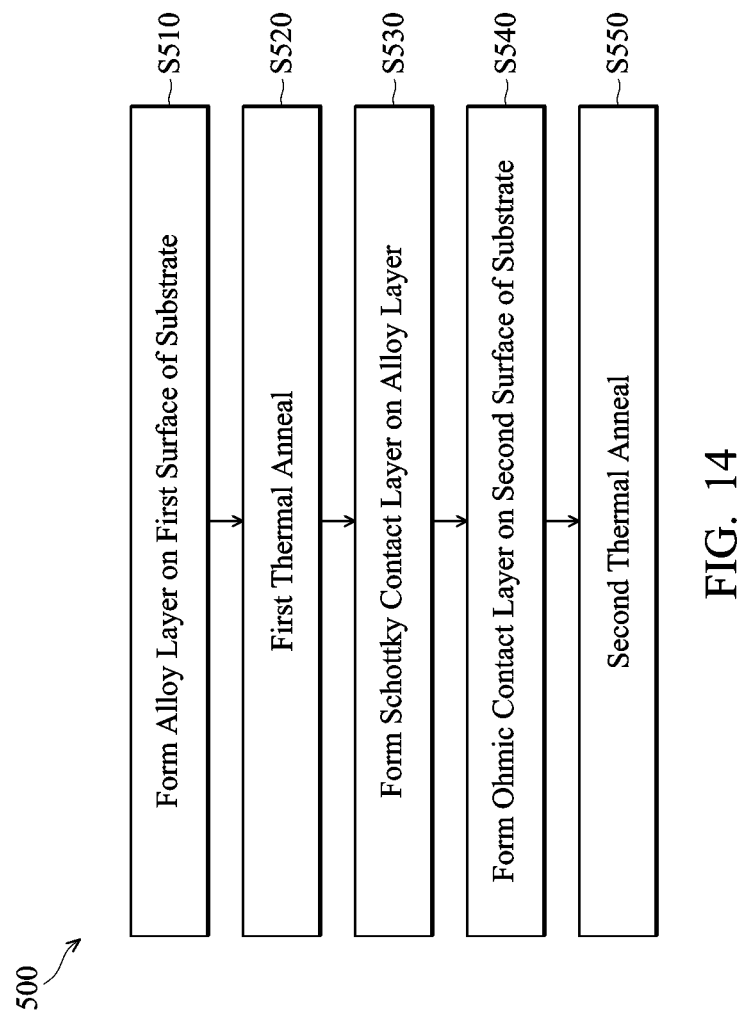
FIG. 14 is a flowchart illustrating a method for fabricating a semiconductor device according to an embodiment of the disclosure.

In some embodiments, the Schottky contact layer 30 is formed before forming the ohmic contact layer 25. As shown in FIG. 14, a method 500 for fabricating a semiconductor device includes an operation S510 of forming an alloy layer 20 on a first surface of the substrate 15 in some embodiments. An operation S520 of performing the first thermal anneal is carried out after the operation S510 of forming the alloy layer 20. After performing the first thermal anneal operation S520, an operation S530 of forming an Schottky contact layer 30 on the second surface of the substrate 15. An operation S540 of forming an ohmic contact layer 25 on the substrate 15 is performed after forming the Schottky contact layer 30. An operation S550 of performing a second thermal anneal is performed after forming the Schottky contact layer 30 and the ohmic contact layer 25.

In some embodiments, the alloy layer 20, ohmic contact layer 25, and Schottky contact layer 30 are simultaneously thermally annealed in a single thermal annealing operation.

FIGS. 15-19 show cross-sectional views of various sequential stages of a process for fabricating a semiconductor device according to an embodiment of the present disclosure. It is understood that additional operations can be provided before, during, and after processes shown by FIGS. 15-19, and some of the operations described below can be replaced or eliminated, for additional embodiments of the method. The order of the operations/processes may be interchangeable. Semiconductor devices 10' formed according to these embodiments have the ohmic contact layer 25' and alloy layer 20' formed on the same side of the semiconductor substrate 15.

Figure 15:
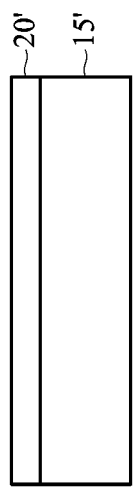
FIG. 15 shows a cross-sectional view of one of the various stages of a sequential process for fabricating a semiconductor device according to an embodiment of the present disclosure.

As shown in FIG. 15, an alloy layer 20' including a first element and second element as is formed over a first element-based semiconductor substrate 15'. The first and second elements are the same as those disclosed herein and the alloy layer 20' can be formed by any of the methods disclosed herein.

Figure 16:
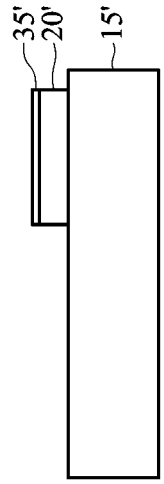
FIG. 16 shows a cross-sectional view of one of the various stages of a sequential process for fabricating a semiconductor device according to an embodiment of the present disclosure.

The alloy layer 20' is patterned using suitable photolithographic and etching operations, as shown in FIG. 16, and a first thermal annealing operation is performed under the conditions disclosed herein to cause the second element atoms in the alloy layer 20' to migrate towards the surface of the alloy 20' layer, forming a thin alloy layer 35' with a second element composition greater than the underlying alloy 20' layer second element composition.

Figure 17:
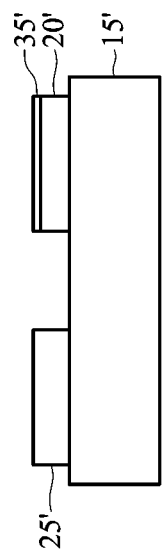
FIG. 17 shows a cross-sectional view of one of the various stages of a sequential process for fabricating a semiconductor device according to an embodiment of the present disclosure.

As shown in FIG. 17, after the first thermal annealing operation, an ohmic contact layer 25' of a suitable conductive metal, as disclosed herein, is formed on the substrate 15' using suitable metal deposition, photolithographic, and etching operations.

Figure 18:
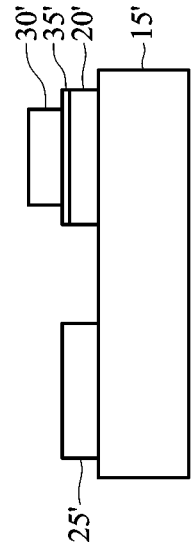
FIG. 18 shows a cross-sectional view of one of the various stages of a sequential process for fabricating a semiconductor device according to an embodiment of the present disclosure.
Figure 19:
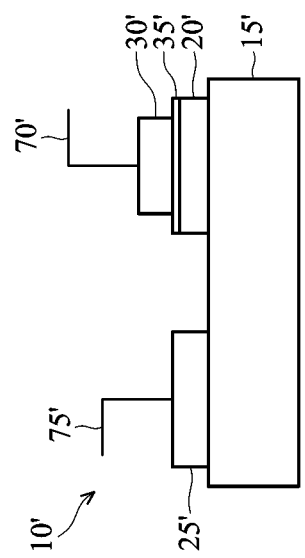
FIG. 19 shows a cross-sectional view of one of the various stages of a sequential process for fabricating a semiconductor device according to an embodiment of the present disclosure.

Next, a Schottky contact layer 30' is formed over the alloy layer 20', as shown in FIG. 18, using suitable deposition, photolithographic, and etching operations. The ohmic contact layer 25' is protected by a suitable masking technique while the Schottky contact layer 30' is being formed in some embodiments. Leads 70', 75' are attached to the Schottky contact layer 30' and the ohmic contact layer 25', respectively, to form a semiconductor device 10' according to some embodiments of the present disclosure, as shown in FIG. 19.

As disclosed herein, a second thermal annealing operation is performed after forming the ohmic contact layer 25' in some embodiments. In other embodiments, the second thermal annealing operation is performed after forming the ohmic contact layer 25' and the Schottky contact layer 30'. In other embodiments, a second thermal annealing operation is performed after forming the ohmic contact layer 25' and a third annealing operation is performed after forming the Schottky contact layer 30'.

Figure 20:
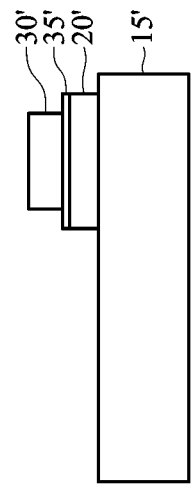
FIG. 20 shows a cross-sectional view of one of the various stages of a sequential process for fabricating a semiconductor device according to an embodiment of the present disclosure.
Figure 21:
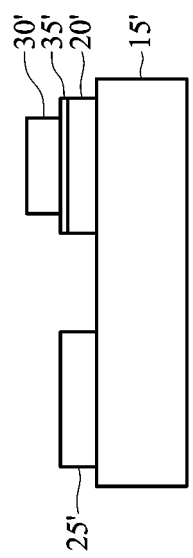
FIG. 21 shows a cross-sectional view of one of the various stages of a sequential process for fabricating a semiconductor device according to an embodiment of the present disclosure.

FIGS. 20 and 21 show cross-sectional views of various sequential stages of a process for fabricating a semiconductor device according to an alternate embodiment of the present disclosure. Starting with the device as shown in FIG. 16, a Schottky contact layer 30' is formed over the alloy layer 30', as shown in FIG. 20, using suitable deposition, photolithographic, and etching operations. An ohmic contact layer 25' is subsequently formed over the substrate 15', as shown in FIG. 21, using suitable deposition, photolithographic, and etching operations. Leads 70', 75' are then attached to the Schottky contact layer 30' and the ohmic contact layer 25', respectively, to form the semiconductor device 10', as shown in FIG. 19, according to some embodiments.

As disclosed herein, a second thermal annealing operation is performed after forming the Schottky contact layer 30' in some embodiments. In other embodiments, the second thermal annealing operation is performed after forming the Schottky contact layer 30' and the ohmic contact layer 25'. In other embodiments, a second thermal annealing operation is performed after forming the Schottky contact layer 30' and a third annealing operation is performed after forming the ohmic contact layer 25'.

Figure 22:
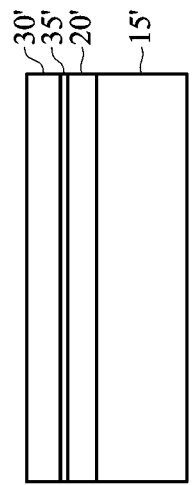
FIG. 22 shows a cross-sectional view of one of the various stages of a sequential process for fabricating a semiconductor device according to an embodiment of the present disclosure.
Figure 23:
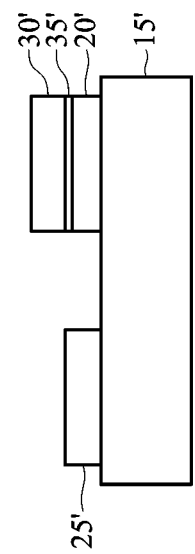
FIG. 23 shows a cross-sectional view of one of the various stages of a sequential process for fabricating a semiconductor device according to an embodiment of the present disclosure.
Figure 24:
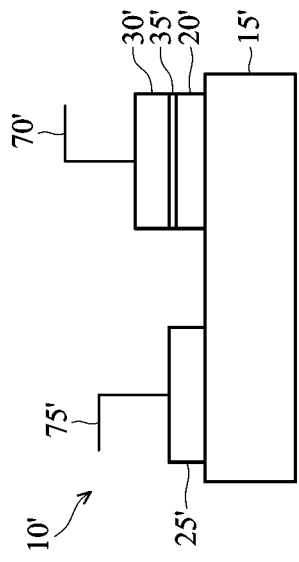
FIG. 24 shows a cross-sectional view of one of the various stages of a sequential process for fabricating a semiconductor device according to an embodiment of the present disclosure.

FIGS. 22-24 show cross-sectional views of various sequential stages of a process for fabricating a semiconductor device according to an alternate embodiment of the present disclosure. It is understood that additional operations can be provided before, during, and after processes shown by FIGS. 22-24, and some of the operations described below can be replaced or eliminated, for additional embodiments of the method. The order of the operations/processes may be interchangeable.

Starting with the device as shown in FIG. 15, a first thermal annealing operation is performed under the conditions disclosed herein to cause the second element atoms in the alloy layer 20' to migrate towards the surface of the alloy 20' layer, forming a thin alloy layer 35' with a second element composition greater than the underlying alloy 20' layer second element composition. A Schottky contact layer 30' is then formed over the alloy layer 30', as shown in FIG. 22.

Next, using suitable photolithographic and etching operations, the Schottky contact layer 30', thin alloy layer 35', and alloy layer 20' are patterned. An ohmic contact layer 25' is subsequently formed over the substrate 15', as shown in FIG. 23, using suitable deposition, photolithographic, and etching operations. The Schottky contact layer 30' is protected by a suitable masking technique while the ohmic contact layer 25' is being formed in some embodiments. Leads 70', 75' are then attached to the Schottky contact layer 30' and the ohmic contact layer 25', respectively, to form the semiconductor device 10', as shown in FIG. 24, according to some embodiments.

As disclosed herein, a second thermal annealing operation is performed after forming the Schottky contact layer 30' in some embodiments. In other embodiments, the second thermal annealing operation is performed after forming the Schottky contact layer 30' and the ohmic contact layer 25'. In other embodiments, a second thermal annealing operation is performed after forming the Schottky contact layer 30' and a third annealing operation is performed after forming the ohmic contact layer 25'.

Figure 25:
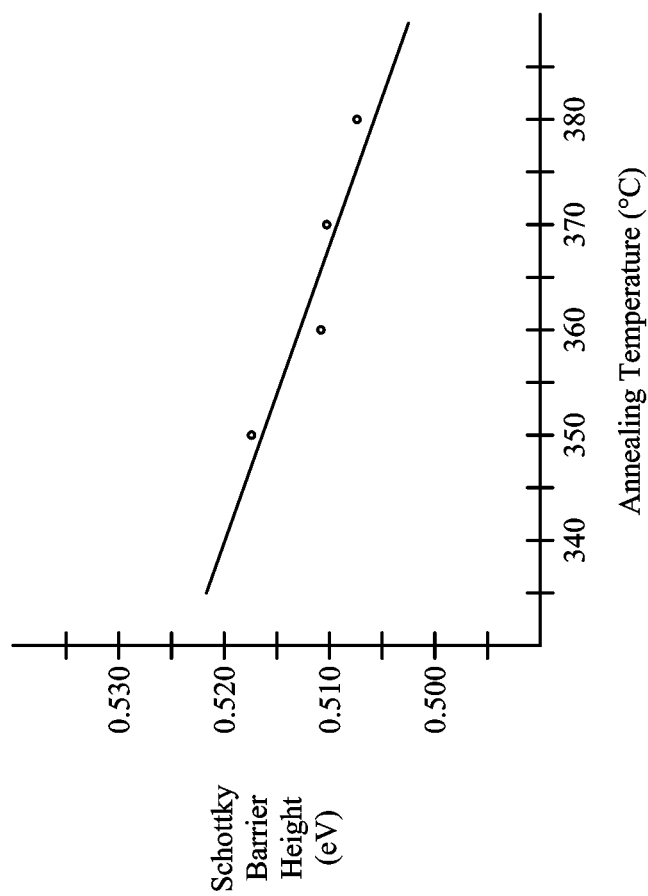
FIG. 25 shows a graph showing the relationship between thermal annealing temperature and Schottky barrier height according to some embodiments of the present disclosure.

The Schottky barrier heights of Ni/n-type GeSn interface grown on an n-type Ge wafer with thermal annealing in accordance with the some embodiments of the disclosure are listed in Table I. As shown in Table I and FIG. 25, the Schottky barrier height decreases as the annealing temperatures increase. In some embodiments, the bandgap of the GeSn surface layer at the interface between the metal and GeSn film decreases as the annealing temperatures increase. FIG. 25 shows a graph showing the relationship between thermal annealing temperature and Schottky barrier height according to some embodiments of the present disclosure.

TABLE I

|  | Annealing Temperatures (° C.) | | | |
| --- | --- | --- | --- | --- |
|  | 350 | 360 | 370 | 380 |
| Schottky Barrier Height (eV) | 0.517 | 0.511 | 0.51 | 0.507 |

As shown in Table I, as the annealing temperature increases there is a greater reduction in the Schottky barrier height. At annealing temperatures below about 390° C. a strain is introduced into the GeSn layer without introducing misfit dislocations into the GeSn layer crystalline structure in some embodiments. However, at temperatures above about 390° C. the GeSn layer starts to relax, and undesirable misfit dislocations are introduced into the crystalline structure of the GeSn layer. Therefore, while increased annealing temperatures further reduce the Schottky barrier height, an increase in dislocations may result.

The present disclosure provides a method for controlling Schottky barrier height in semiconductor devices, and semiconductor devices with reduced Schottky barrier height. In some embodiments, the Schottky barrier height is reduced. Metal contact layers have a high Schottky barrier height. The Schottky barrier height between the metal contact layer and the semiconductor substrate can be controlled according to the present disclosure by forming and annealing an alloy interfacial layer including at least a first Group IV element and a second Group IV element between the first Group IV-based element substrate and the metal contact layer. Thus, Group IV element-based substrates can be used to improve the performance of a number of semiconductor devices, including Schottky barrier diodes and Schottky transistors. For example, the reduction of the Schottky barrier height reduces the resistance at the metal/semiconductor junction. A smaller Schottky barrier height provides a lower turn on voltage, thereby improving a current-voltage characteristic of a semiconductor device.

In some embodiments, Ge-based substrates are desirable for next-generation semiconductor devices. The Schottky barrier height between the metal contact layer and the Ge-based substrate can be controlled according to the present disclosure by forming and annealing a GeSn interfacial layer between the Ge-based substrate and the metal contact layer. Thus, Ge-based substrates can be used to improve the performance of a number of semiconductor devices, including Schottky barrier diodes and Schottky transistors.

In some embodiments, the disclosed methods are used to fabricate Schottky transistors. Schottky transistors, also known as Schottky-clamped transistors, are a combination of a transistor and a Schottky diode that prevents the transistor from saturating by diverting the excess input current. During the fabrication of the Schottky transistors, thermal annealing operations, as disclosed herein, are performed after the formation of any of the alloy layer, ohmic contact layer, and Schottky contact layer. In some embodiments, the alloy layer and the ohmic contact layer, or the alloy layer and the Schottky contact layer are simultaneously thermally annealed. In some embodiments, the alloy layer, ohmic contact layer, and Schottky contact layer are simultaneously thermally annealed in a single thermal annealing operation.

It will be understood that not all advantages have been necessarily discussed herein, no particular advantage is required for all embodiments or examples, and other embodiments or examples may offer different advantages.

An embodiment of the present disclosure is a method for controlling Schottky barrier height in a semiconductor device including forming an alloy layer including at least a first element and a second element on a surface of a semiconductor substrate. The semiconductor substrate is a first element-based semiconductor substrate, and the first element and the second element are Group IV elements. A first thermal anneal of the alloy layer and the first element-based substrate is performed. The first thermal anneal causes the second element in the alloy layer to migrate towards a surface of the alloy layer. A Schottky contact layer is formed on the alloy layer after the first thermal anneal. In an embodiment, the semiconductor substrate is a first element-based wafer, a first element-on-insulator substrate, or an epitaxial first element layer. In an embodiment, the alloy layer as formed on the first element-based substrate has a second element content of 0.1 atomic % to 12 atomic % based on a total amount of the first element and the second element in the alloy layer. In an embodiment, the first thermal anneal is performed at a temperature of 300° C. to 460° C. In an embodiment, the method includes forming an ohmic contact layer on the semiconductor substrate. In an embodiment, the method includes performing a second thermal anneal on the semiconductor device after forming the ohmic contact layer. In an embodiment, the Schottky contact layer is formed after forming the ohmic contact layer. In an embodiment, the method includes performing a third thermal anneal on the semiconductor device after forming the Schottky contact layer. In an embodiment, the first element is Ge and the second element is Sn.

In another embodiment of the present disclosure a method for fabricating a Schottky barrier semiconductor device includes forming an alloy layer including at least a first element and a second element on a first element-based substrate to form an interface between a first surface of the alloy layer and a first surface of the first element-based substrate. The first element and second element are different elements selected from the group consisting C, Si, Ge, and Sn, and the alloy is selected from the group consisting of SiC, SiGe, SiSn, GeSn, SiGeSn, and SiGeC. A first thermal anneal of the alloy layer and the first element-based substrate is performed. An ohmic contact layer is formed on a second surface of the first element-based substrate opposing the first surface of the first element-based substrate. A Schottky contact layer is formed on a second surface of the alloy layer opposing the first surface of the alloy layer after the first thermal anneal. In an embodiment, the method includes performing a second thermal anneal on the semiconductor device after the forming the ohmic contact layer. In an embodiment, the method includes performing a third thermal anneal on the semiconductor device after forming the Schottky contact layer. In an embodiment, the first element is Ge and the second element is Sn.

In another embodiment of the present disclosure, a Schottky barrier semiconductor device includes an alloy layer including at least a first element and a second element layer having opposing first and second surfaces disposed on a surface of a first element-based substrate, wherein the first surface of the alloy layer is adjacent the first element-based substrate. The first element and second element are Group IV elements. An ohmic contact layer is disposed on the surface of the first element-based substrate. The second surface of the substrate is further away from the alloy layer than the first surface of the substrate. A Schottky contact layer is disposed on a second surface of the alloy layer. The second surface of the alloy layer is further away from the substrate than the first surface of the alloy layer. A concentration of second element in the alloy layer is greater at the second surface of the alloy layer than in other portions of the alloy layer. In an embodiment, a concentration of second element in the alloy layer at the second surface of the alloy layer ranges from 14% to 25%, and a concentration of second element in other portions of the alloy layer ranges from 0.1 atomic % to 12 atomic % based on a total amount of the first element and the second element in the alloy layer. In an embodiment, a thickness of the alloy layer having a second element concentration of 14% to 25% ranges from about 0.5 nm to about 5 nm. In an embodiment, the first element is Ge and the second element is Sn. In an embodiment, the Schottky contact layer is formed of at least one selected from the group consisting of Al, Au, Er, Gd, Hf, La, Ni, Pt, Sc, Ti, Y, Yb, and Zr. In an embodiment, the ohmic contact layer is formed of In, AuGa, or AuSb. In an embodiment, a Schottky barrier height at an interface between the Schottky contact layer and the alloy layer ranges from 0.50 eV to 0.52 eV.

Another embodiment of the present disclosure is a method for reducing a Schottky barrier height in a semiconductor device including forming a GeSn layer on a surface of a Ge-based substrate, and performing a first thermal anneal of the GeSn layer and the Ge-based substrate. A Schottky contact layer is formed on the GeSn layer after the first thermal anneal. In an embodiment, the Ge substrate is a Ge wafer, a Ge-on-insulator (GOI) substrate, or an epitaxial Ge layer. In an embodiment, the GeSn layer as formed on the Ge-based substrate has an Sn content of 0.1 atomic % to 12 atomic % based on a total amount of Ge and Sn in the GeSn layer. In an embodiment, the first thermal anneal causes Sn in the GeSn layer to migrate towards a surface of the GeSn layer. In an embodiment, the first thermal anneal is performed at a temperature of 300° C. to 460° C. In an embodiment, an ohmic contact layer is formed on the surface of the Ge-based substrate. In an embodiment, a second thermal anneal is performed on the semiconductor device after forming the ohmic contact layer. In an embodiment, the Schottky contact layer is formed after forming the ohmic contact layer. In an embodiment, a third thermal anneal is performed on the semiconductor device after forming the Schottky contact layer. In an embodiment, the first thermal anneal lowers the Schottky barrier height.

Another embodiment of the present disclosure is a method for fabricating a Schottky barrier semiconductor device, including forming a GeSn layer on a Ge-based substrate to form an interface between a first surface of the GeSn layer and a first surface of the Ge-based substrate. A first thermal anneal of the GeSn layer and the Ge-based substrate is performed. An ohmic contact layer is formed on the surface of the Ge-based substrate, and a Schottky contact layer is formed on a second surface of the GeSn layer opposing the first surface of the GeSn layer after the first thermal anneal. In an embodiment, a second thermal anneal is performed on the semiconductor device after the forming the ohmic contact layer. In an embodiment, a third thermal anneal is performed on the semiconductor device after forming the Schottky contact layer.

Another embodiment of the present disclosure is a barrier semiconductor device, including a GeSn layer having opposing first and second surfaces disposed on a surface of a Ge-based substrate, wherein the first surface of the GeSn layer is adjacent the Ge-based substrate. An ohmic contact layer is disposed on the surface of the substrate. A Schottky contact layer is disposed on a second surface of the GeSn layer, wherein the second surface of the GeSn layer is further away from the substrate than the first surface of the GeSn layer. A concentration of Sn in the GeSn layer is greater at the second surface of the GeSn layer than in other portions of the GeSn layer. In an embodiment, a thickness of the GeSn layer is 1 nm to 300 nm. In an embodiment, a concentration of Sn in the GeSn layer at the second surface of the GeSn layer ranges from 14 atomic % to 25 atomic %, and the concentration of Sn in the other portions of the GeSn layer ranges from 0.1 atomic % to 12 atomic % based on a total amount of Ge and Sn in the GeSn layer. In an embodiment, the Schottky contact layer is formed of at least one selected from the group consisting of Al, Au, Er, Gd, Hf, La, Ni, Pt, Sc, Ti, Y, Yb, and Zr. In an embodiment, the ohmic contact layer is formed of In, AuGa, or AuSb. In an embodiment, the Ge substrate is a Ge wafer, a Ge-on-insulator (GOI) substrate, or an epitaxial Ge layer. In an embodiment, the GeSn layer has a graded composition with a concentration of the Sn being at a minimum at an interface of the substrate and the GeSn layer and a concentration of the Sn being at a maximum at an interface of the GeSn layer and the Schottky contact layer. In an embodiment, a Schottky barrier height at an interface between the Schottky contact layer and the alloy layer ranges from 0.50 eV to 0.52 eV.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

It will be understood that not all advantages have been necessarily discussed herein, no particular advantage is required for all embodiments or examples, and other embodiments or examples may offer different advantages.

What is claimed is:

1. A method for controlling Schottky barrier height in a semiconductor device comprising:
   forming an alloy layer comprising at least a first element and a second element on a surface of a semiconductor substrate, wherein the semiconductor substrate is a first element-based semiconductor substrate, and the first element and the second element are Group IV elements;
   performing a first thermal anneal of the alloy layer and the first element-based semiconductor substrate at a temperature of 300° C. to 460° C., wherein the first thermal anneal causes the second element in the alloy layer to migrate towards a first surface of the alloy layer away from the semiconductor substrate; and
   forming a Schottky contact layer on the first surface of the alloy layer after the first thermal anneal.

2. The method according to claim 1, wherein the semiconductor substrate is a first element-based wafer, a first element-on-insulator substrate, or an epitaxial first element layer.

3. The method according to claim 1, wherein the alloy layer has a second element content of 0.1 atomic % to 12 atomic % based on a total amount of the first element and the second element in the alloy layer.

4. The method according to claim 1, further comprising forming an ohmic contact layer on the semiconductor substrate.

5. The method according to claim 4, further comprising performing a second thermal anneal on the semiconductor device after forming the ohmic contact layer.

6. The method according to claim 4, wherein the Schottky contact layer is formed after forming the ohmic contact layer.

7. The method according to claim 6, further comprising performing a third thermal anneal on the semiconductor device after forming the Schottky contact layer.

8. The method according to claim 1, wherein the first element is Ge and the second element is Sn.

9. The method according to claim 1, wherein the first thermal anneal lowers the Schottky barrier height.

10. The method according to claim 1, further comprising a Sn-rich layer at a top portion of the alloy layer in contact with the Schottky contact layer.

11. A method for fabricating a Schottky barrier semiconductor device, comprising:
    forming an alloy layer comprising at least a first element and a second element layer on a first element-based substrate to form an interface between a first surface of the alloy layer and a surface of the first element-based substrate, wherein the first element and second element are different elements selected from the group consisting C, Si, Ge, and Sn, and wherein the alloy layer is selected from the group consisting of SiC, SiGe, SiSn, GeSn, SiGeSn, and SiGeC;
    performing a first thermal anneal of the alloy layer and the first element-based substrate at a temperature of 300° C. to 460° C., wherein the first thermal anneal causes the second element in the alloy layer to migrate towards a second surface of the alloy layer opposing the interface;
    forming an ohmic contact layer on the surface of the first element-based substrate; and forming a Schottky contact layer on the second surface of the alloy layer after the first thermal anneal.

12. The method according to claim 11, further comprising performing a second thermal anneal on the Schottky barrier semiconductor device after forming the ohmic contact layer.

13. The method according to claim 11, further comprising performing a third thermal anneal on the Schottky barrier semiconductor device after forming the Schottky contact layer.

14. The method according to claim 11, wherein the first element is Ge and the second element is Sn.

15. A Schottky barrier semiconductor device, comprising:
    a Ge-based substrate;
    an alloy layer comprising at least Ge and Sn having opposing first and second surfaces disposed on a top surface of the Ge-based substrate, wherein the first surface of the alloy layer is adjacent the Ge-based substrate;

an ohmic contact layer disposed on a bottom surface of the Ge-based substrate; and a Schottky contact layer disposed on the second surface of the alloy layer, wherein the second surface of the alloy layer is further away from the Ge-based substrate than the first surface of the alloy layer, wherein the alloy layer comprises an Sn-rich portion in contact with the Schottky contact layer that is formed by a thermal anneal process at a temperature of 300° C. to 460° C., wherein a concentration of the Sn in the Sn-rich portion of the alloy layer ranges from 14 atomic % to 25 atomic % based on a total amount of the Ge and the Sn in the alloy layer.

16. The Schottky barrier semiconductor device according to claim 15, wherein a concentration of the Sn in other portions of the alloy layer ranges from 0.1 atomic % to 12 atomic % based on a total amount of the Ge and the Sn in the alloy layer.

17. The Schottky barrier semiconductor device according to claim 15, wherein the Schottky contact layer is formed of at least one selected from the group consisting of Al, Au, Er, Gd, Hf, La, Ni, Pt, Sc, Ti, Y, Yb, and Zr.

18. The Schottky barrier semiconductor device according to claim 15, wherein the ohmic contact layer is formed of In, AuGa, or AuSb.

19. The Schottky barrier semiconductor device according to claim 15, wherein a Schottky barrier height at an interface between the Schottky contact layer and the alloy layer ranges from 0.50 eV to 0.52 eV.

20. The Schottky barrier semiconductor device according to claim 15, wherein the concentration of the Sn in the Sn-rich portion of the alloy layer ranges from 20 atomic % to 25 atomic %.

* * * * *